United States Patent [19]

Shi

[11] Patent Number: 5,114,909
[45] Date of Patent: May 19, 1992

[54] FLUX PINNING BY PRECIPITATES IN THE BI-SR-CA-CU-O SYSTEM

[75] Inventor: Donglu Shi, Chicago, Ill.

[73] Assignee: The United States of America as represented by the Department of Energy, Washington, D.C.

[21] Appl. No.: 486,636

[22] Filed: Feb. 28, 1990

[51] Int. Cl.⁵ ................ H01B 12/00; H01L 39/12
[52] U.S. Cl. .................... 505/1; 505/782; 505/733; 501/126; 252/518; 252/521
[58] Field of Search ................ 505/1, 733, 782

[56] References Cited

PUBLICATIONS

Shi et al., "Flux Pinning by Precipitates in the Bi-Sr-Ca-Cu-O System", *Phy. Rev. B*, vol. 40, #7, Sep. 1, 1989, pp. 5255-5258.
Shi et al., "110K Superconductivity in Crystallized Bi-Sr-Ca-Cu-O Glasses", *Physics C*, 156, Nov. or Dec. 1988, pp. 822-826.
Shi et al., "Formation of the 110-K Superconducting Phase via the Amorphous State in the Bi-Ca-Sr-Cu-O System", *Phy. Rev. B.*, vol. 3, #13, May 1, 1989, pp. 9091-9098.

*Primary Examiner*—William R. Dixon, Jr.
*Assistant Examiner*—C. Melissa Bonner
*Attorney, Agent, or Firm*—James W. Weinberger; Thomas G. Anderson; William R. Moser

[57] ABSTRACT

A fundamental pinning mechanism has been identified in the Bi-Sr-Ca-Cu-O system. The pinning strength has been greatly increased by the introduction of calcium- and copper-rich precipitates into the sample matrix. The calcium and copper are supersaturated in the system by complete melting, and the fine calcium and copper particles precipitated during subsequent crystallization anneal to obtain the superconducting phases. The intragrain critical current density has been increased from the order of $10^5$ A/cm$^2$ to $10^7$ A/cm$^2$ at 5 T.

11 Claims, 5 Drawing Sheets

FLUX PINNING BY PRECIPITATES IN THE BI-SR-CA-CU-O SYSTEM

CONTRACTUAL ORIGIN OF THE INVENTION

The U.S. Government has rights in this invention under Contract No. W-31-109-ENG-38 between the U.S. Department of Energy and the University of Chicago, representing Argonne National Laboratory.

BACKGROUND OF THE INVENTION

This invention relates generally to enhanced current densities by the formation of precipitates in ceramic-oxide superconductors to improve flux pinning and more particularly to the improvement in current densities by the enrichment of certain components in the compositions to promote the formation of precipitates in the Bi-Sr-Ca-Cu-O system.

High-$T_c$ superconductors in the Bi-Sr-Ca-Cu-O system have been reported to have low transport and magnetization critical current densities in polycrystalline form. The low transport property may be associated with the weak link effect resulting from the lattice misalignment and secondary phases at the grain boundaries, as in the case of $YBa_2Ca_3O_{7-x}$. The magnetization critical current density has been found to be strongly dependent on field and temperature and is much lower than that of $YBa_2Cu_3O_{7-x}$. This difference has been attributed to the lack of pinning centers, such as twin planes, in the Bi-Sr-Ca-Cu-O superconductors prepared by conventional ceramic techniques. Previous studies have also indicated that thermally assisted flux creep is much more pronounced in the Bi-Sr-Ca-Cu-O system. Significant resistance is present even at temperatures well below $T_c$ in a magnetic field due to the flux creep effects. The pinning centers in $YBa_2Cu_3O_{7-x}$ have been clearly identified as the twin boundaries. Therefore, it is of utmost importance to analyze the pinning mechanisms in this system so that additional pinning centers can then be introduced for the possible enhancement of the critical current density.

Critical current densities in ceramic superconducting compositions relate to both intergrain current density involving transfer between grains and to intracurrent density involving transfer within grains. Flux pinning is particularly important for increased intergrain current densities. Flux pinning sites may vary in different compositions.

OBJECTS AND SUMMARY OF THE INVENTION

Accordingly, it is an object of the present invention to increase the number of magnetic flux-pinning centers in ceramic-oxide electrically conductive materials.

Another object of the present invention is to promote the formation of precipitates in a Bi-Sr-Ca-Cu-O superconductor to increase the critical current density by increasing the number of flux pinning sites.

A further object of the present invention is to form ceramic-oxide glass superconductors containing enriched concentrations of Ca and Cu with crystallization and precipitation induced by annealing for increasing the number of flux-pinning centers in the superconductor.

This invention relates to the flux-pinning behavior identified in crystallized samples prepared by splat quenching in the Bi-Sr-Ca-Cu-O system. The magnetization critical current density has been greatly enhanced by introducing calcium-and copper-rich precipitates into the system. The results of theoretical fitting of the data show that the flux lines are pinned through different mechanisms in the samples containing different superconducting phases. Volume pinning has been identified in the samples with the majority of the 85K phase, an observation that is consistent with electron microscopy results. Two distinct pinning force peaks have been found in the multiphase samples, indicating two different pinning mechanisms. The increase of critical current density has been found to be directly related to the amount of precipitate introduced into the samples.

BRIEF DESCRIPTION OF THE DRAWINGS

The appended claims set forth those novel features which characterize the invention. However, the invention itself, as well as further objects and advantages thereof, will be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Several different types of ceramic oxides were first heated to temperatures above their respective melting points to form a liquid. Extremely dense glass samples with the nominal compositions of $Bi_2Sr_2CaCu_2O_x$(2212), $Bi_2Sr_2Ca_2Cu_3O_x$ (2223), $Bi_2Sr_2Ca_3Cu_4O_x$(2234), and $Bi_2Sr_2Ca_4Cu_5O_x$(2245), where x≈10, were then made by a splat quenching method as described in D. Shi, M. Blank, M. Patel, D. G. Hinks, A. W. Mitchell, K. Vandervoort, and H. Claus, Physica C 156, 822 (1988); and D. Shi, M. Tang, K. Vandervoort, and H. Claus, accepted Phys. Rev. B, 1989. The as-quenched glass samples were subsequently annealed at 870° C. in air for various times After annealing, the samples were slowly cooled to room temperature. The superconducting properties of the annealed products were analyzed using x-ray diffraction (XRD), electrical resistivity and magnetization shielding measurements, transmission electron microscopy (TEM), scanning electron microscopy (SEM), and an energy dispersive spectrum (EDS) technique. Improved superconducting properties were determined with high field magnetization measurements and flux pinning analysis of some of the crystallized samples. The magnetization data were taken on a commercial SQUID magnetometer at 10K up to 5 T.

The 2212 sample annealed at 870° C. for 1 day contains mostly the 85K phase. The 2223 sample annealed at 870° C. for 1 day exhibited a single transition near 85K in both resistivity and magnetization shielding measurements. X-ray diffraction data also show that the sample contains mostly the 85K phase (it has the composition of $Bi_2Csr_2CaCu_2Ox$) and a very small amount of $Ca_2CuO_3$.

The 110K superconducting phase (having the composition of $Bi_2Sr_2Ca_2Cu_3O_x$) starts to form as the calcium and copper concentration in the starting composition is increased to 2234 and 2245. A single resistive and magnetization transition was observed near 110K in the 2234 sample annealed at 870° C. for 10 days and in the 2245 sample annealed for 3 days. A large volume percent of the 110K phase and some 85K phase have been identified by x-ray diffraction in these samples. The samples of all compositions investigated which were annealed at 870° C. for 1 day were found to be mostly the 85K phase.

Figure 1:
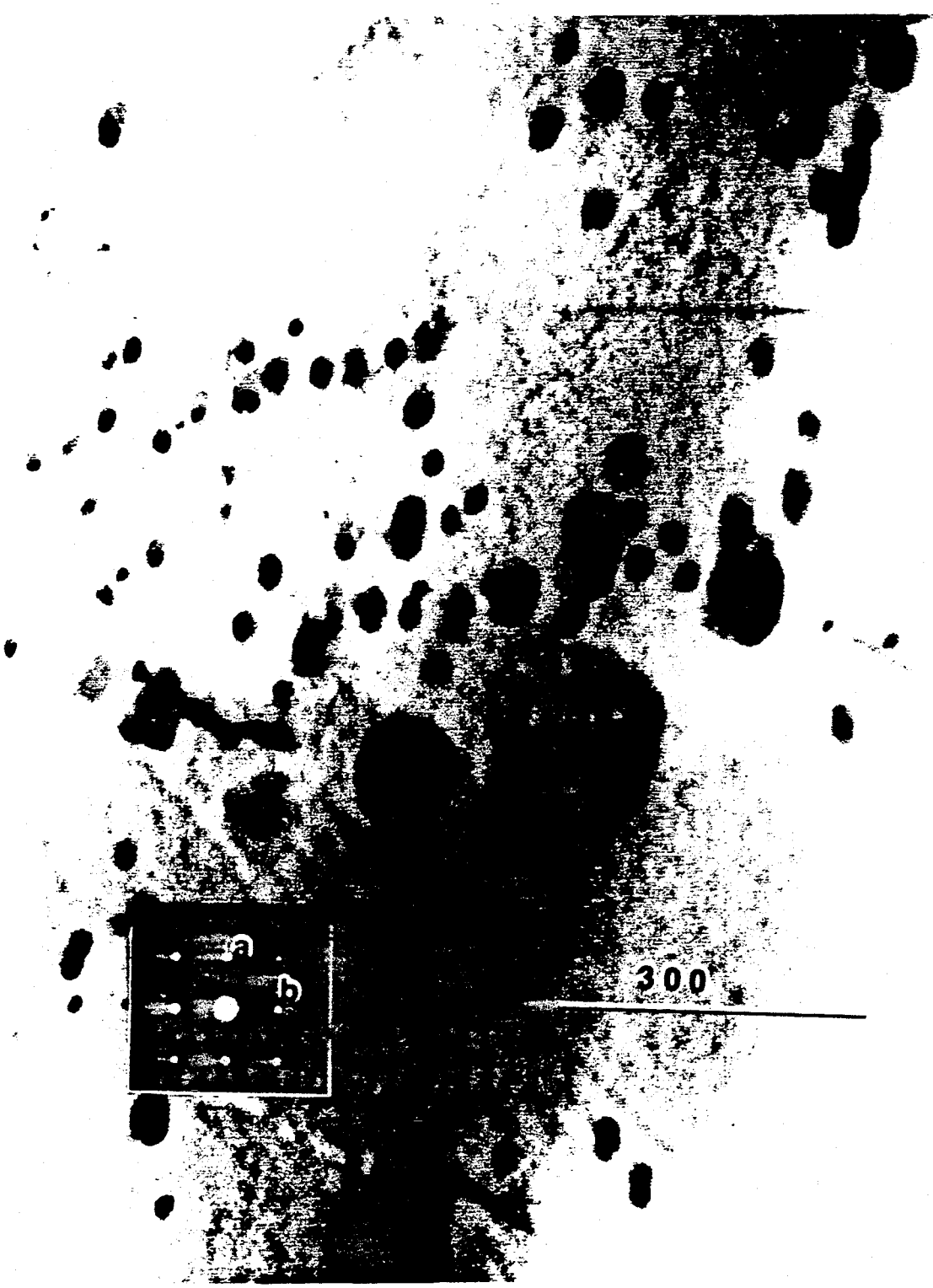
FIG. 1 is a TEM photograph of $Bi_2-Sr_2-Ca_4Cu_5O_x$ (2245) annealed for three days showing the existence of finely dispersed calcium- and copper-rich precipitates, with the electron diffraction pattern taken from the (001) zone axis of the matrix area shown in the inset.
Figure 2:
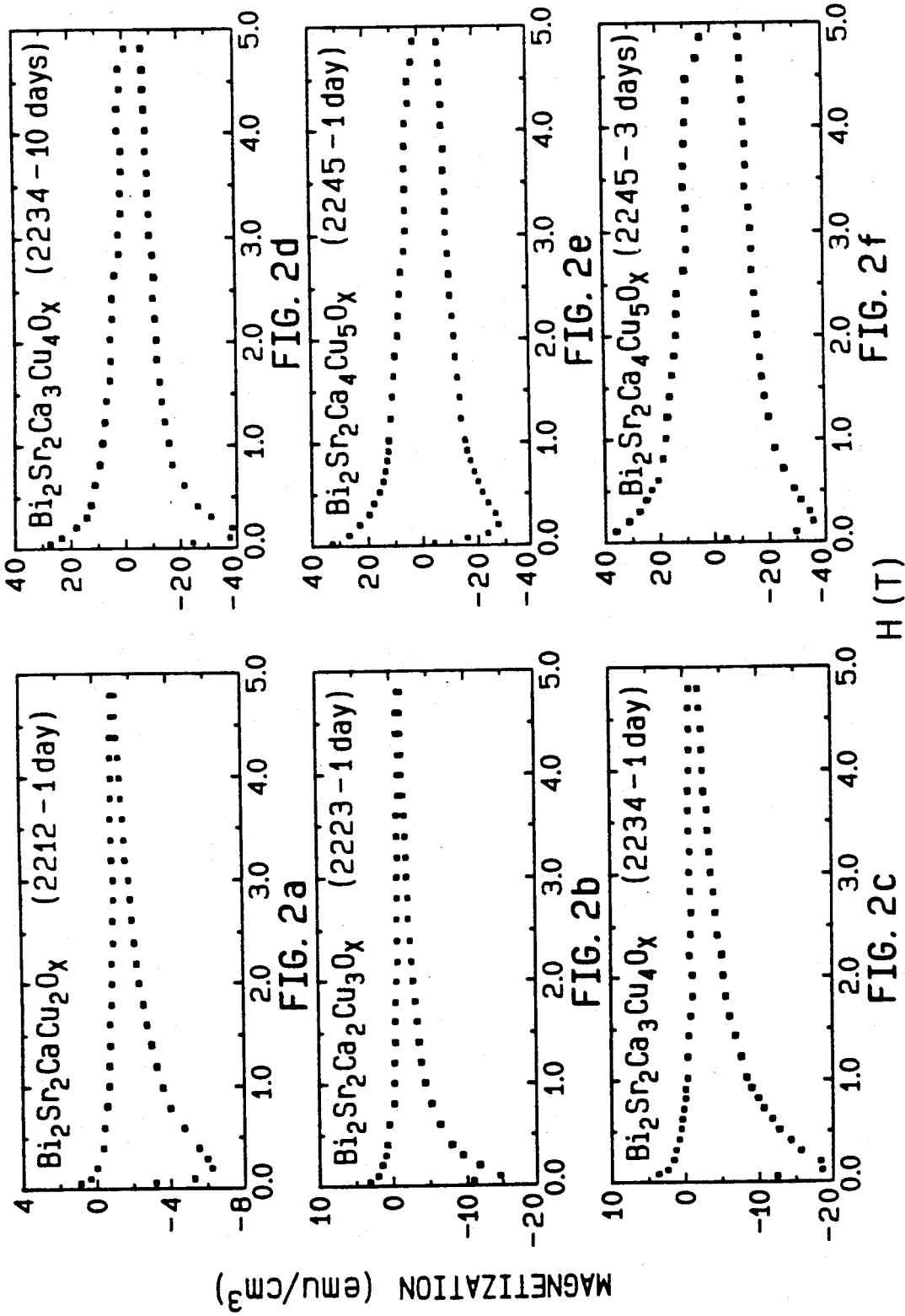
FIGS. 2a-2f show the magnetization curves for the crystalline samples annealed at 870° C. for the indicated annealing times: (2a) 2212 annealed one day, (2b) 2223 annealed one day, (2c) 2234 annealed one day, (2d) 2234 annealed ten days, (2e) 2245 annealed one day, and (2f) 2245 annealed three days.

Based on TEM and XRD data, it was found that in all the crystallized samples, there exists a certain amount of calcium-and copper-rich impurity phase $Ca_2CuO_3$, which precipitated from the amorphous matrix during the crystallization process. The amount of precipitate was found to increase as the calcium and copper levels increase in the starting materials. Our TEM experimental results indicate that only a very small quantity of the precipitates was observed in the 2223 sample which was annealed at 870° C. for 1 day and had mostly the 85K phase. A large amount of the calcium- and copper-rich phase formed in the 2234 and 2245 samples. As shown in FIG. 1, which is a TEM photograph of $Bi_2$-$Sr_2$-$Ca_4$-$Cu_5O_x$ with the diffraction pattern taken from the (001) zone axis of the matrix shown in the inset, for a 2245 sample annealed at 870° C. for 3 days, the calcium- and copper-rich precipitates are finely dispersed rather evenly in the sample matrix, and their dimensions vary widely from less than 0.01 um to almost 0.10 um. The inset in FIG. 1 is an electron diffraction pattern taken from the (001) zone axis of the matrix area which is the 110K superconducting phase.

Magnetization curves shown in FIGS. 2a-2f were taken at 10K up to 5 T for five crystallized samples with nominal compositions of 2223, 2234 and 2245. As can be seen in these figures, the samples exhibit rather different hysteresis. The overall hysteresis width increases rapidly from FIG. 2a to FIG. 2f, indicating increased pinning strength. As can also be seen, the field required to reduce the hysteresis to less than 5% of the maximum value (Ho) increases from the 2212 composition of FIG. 2a to the 2245 composition of FIG. 2f. For the 2212 and 2223 samples the $H_o$ value is less than 5 T, while respectable hysteresis still remains at the same field for the 2234 and the 2245 samples.

Figure 3:
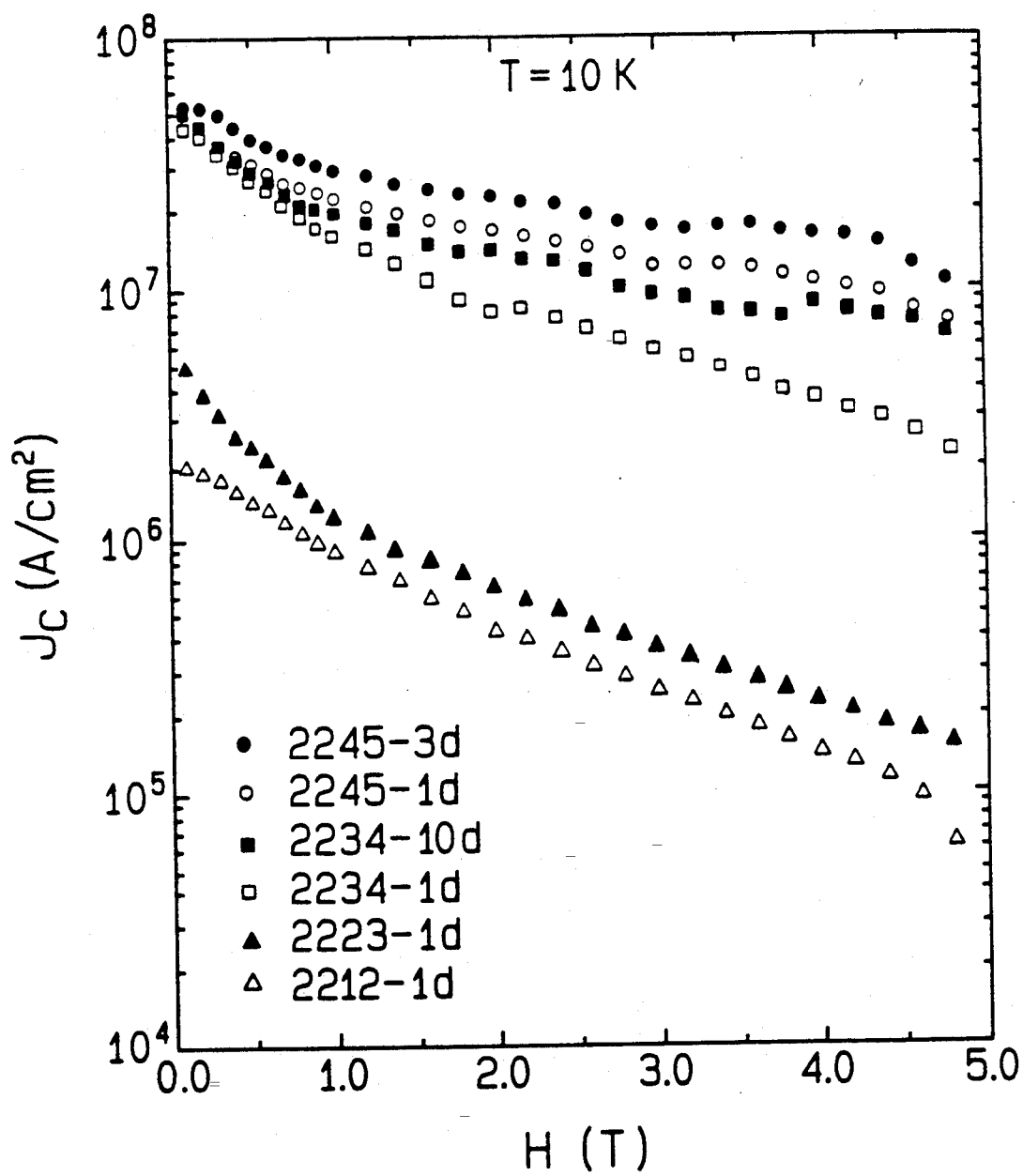
FIG. 3 illustrates the critical current density versus field for the samples with the indicated compositions and annealing conditions, with $J_c$ estimated from the Bean model based on magnetization data shown in FIGS. 2a-2f.

The intra-grain critical current density, $J_c$, has been estimated using the Bean model described in C. P. Bean, Rev. Mod. Phys. 36, 31 (1964) and A. Umezawa, G. W. Crabtree, J. Z. Liu, H. W. Weber, W. K. Kwok, L. H. Nunez, T. J. Moran, and C. H. Sowers, Phys. Rev. B 36 (13), 7151 (1988), based on magnetization measurements. The $J_c$ values are plotted against the applied field H, shown in FIG. 3. As can be seen in FIG. 3, the $J_c$ values of the 2212 and the 2223 samples are on the order of $10^6$ A/cm$^2$ in the low field range (<1T) and the decrease to the order of $10^5$ A/cm$^2$ near 5 T. The critical current density $J_c$ values of the 2234 and 2245 samples increase substantially to approximately $0.5 \times 10^8$ A/cm$^2$ at near zero field and drop only slightly as the field increases to 5 T. It is to be noted that the $J_c(H)$ values increase with increasing calcium and copper content in the nominal composition, and the highest $J_c(H)$ has been obtained in the 2245 sample annealed for 3 days at 870° C. The amount of precipitates greatly increases as the calcium and copper content is increased in the nominal composition. Therefore, this increase in critical current density is a consequence of the enhanced pinning effect due to the increased precipitation.

Figure 4:
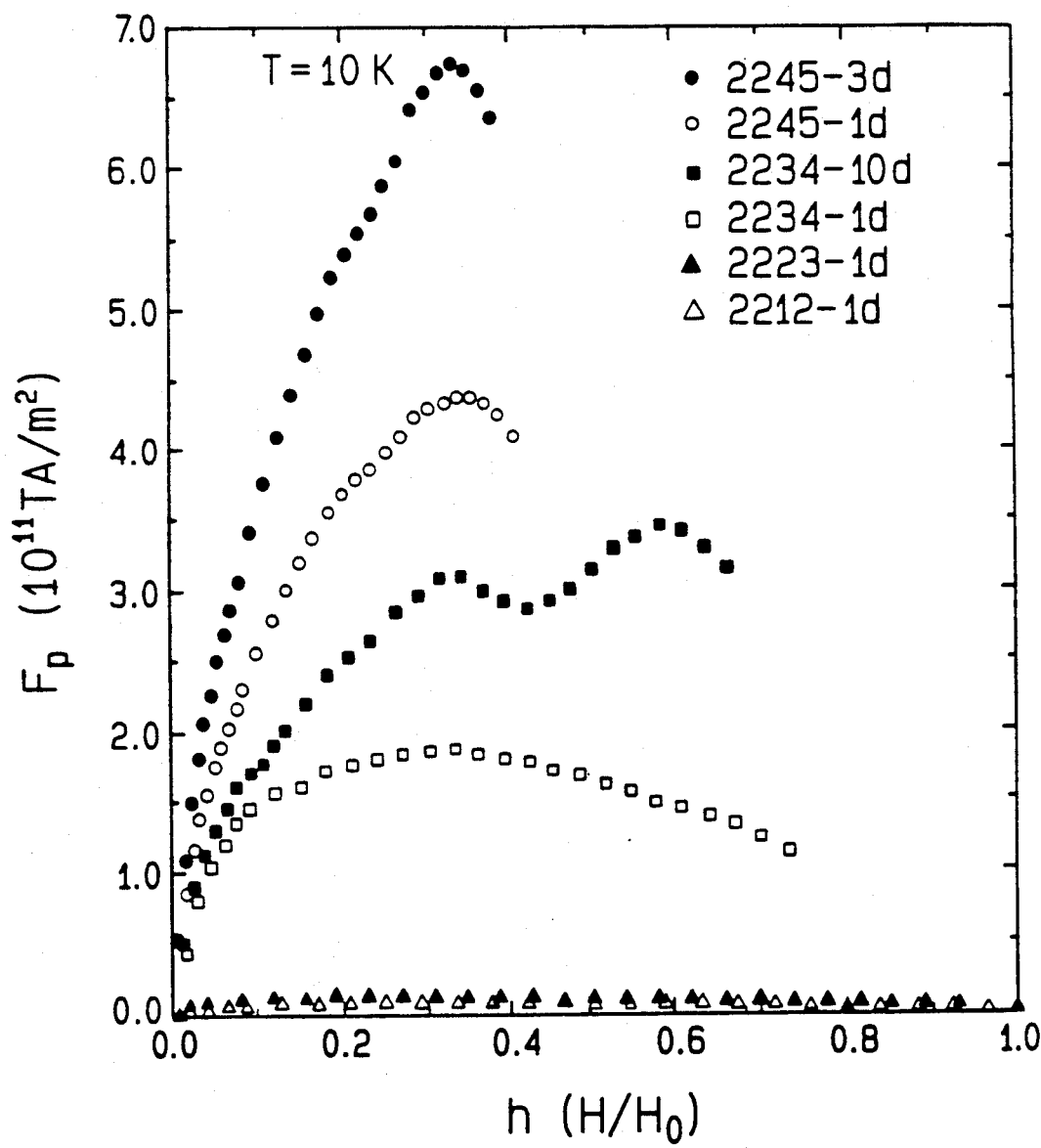
FIG. 4 shows flux-pinning force density $F_p$ ($J_c \times H$) versus reduced field h ($H/H_o$) for the samples with the indicated compositions and annealing conditions, with the peak in $F_p$ occurring at h=0.33 for all the samples and an additional peak at h=0.06 for the 2234 sample annealed ten days.
Figure 5A:
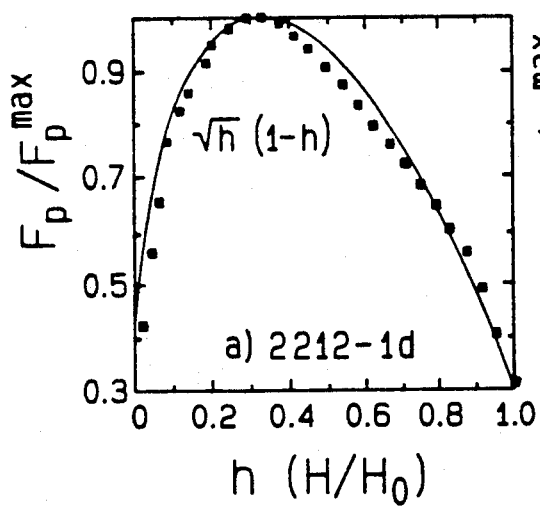
FIGS. 5a-5d show reduced pinning force density versus reduced field for the samples annealed at 870° C. for one day, with the samples (5a) 2212, (5b) 2223, (5c) 2234, and (5d) 2245 fitted with the flux pinning function $h^{\frac{1}{2}}$(1-h) for magnetic, volume, and normal pinning.
Figure 5C:
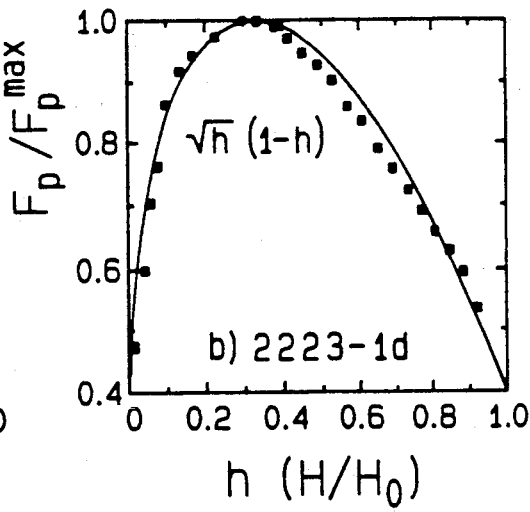
Figure 5B:
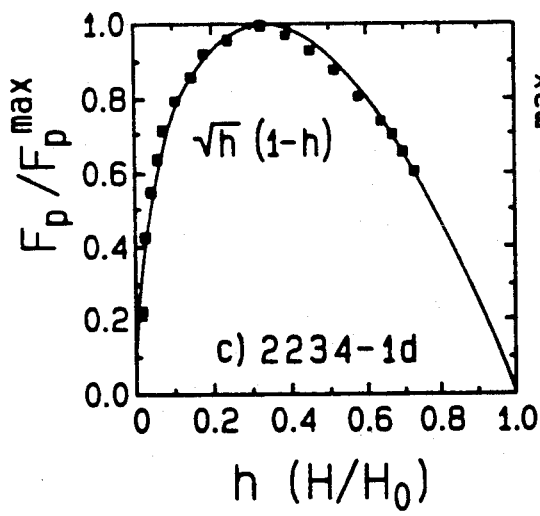
Figure 5D:
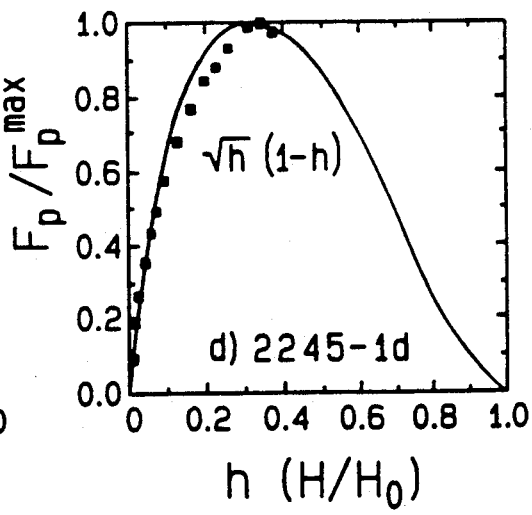

FIG. 4 shows the flux pinning force density, $F_p$ versus the reduced field h ($=H/H_o$), for all the samples whose $J_c(H)$ values are shown in FIG. 3. $H_o$ corresponds to the value of the applied field at which the magnetic irreversibility disappears. It is also referred to as the "quasi de Almeida-Thouless line". For some samples, $H_o$ values could only be obtained by extrapolation since the available field cannot exceed 5 T. Thermally activated flux creep becomes much more pronounced in the Bi-Sr-Ca-Cu-O system at temperatures approaching the transition temperature; however, our experimental results are obtained at 10K, where the flux creep effects are not as significant.

As shown in FIG. 4, the pinning force density, Fp, is quite different in the six samples. The 2212 and 2223 samples annealed for one day have mostly the 85 k phase and the lowest values of the flux-pinning force density, because they have the least amount of precipitates. The 2234 and 2245 samples annealed for one day contain mostly the 85K phase and have progressively larger values of the flux-pinning force density as the amount of calcium- and copper-rich precipitation increases. All four of these samples exhibit a maximum in the flux-pinning force density at h=0.33, which indicates volume normal pinning via the magnetic interaction. The remaining two samples are different in that they contain significant amounts of the 110K superconducting phase. Specifically, the 2234 sample annealed 10 days exhibits two peaks, one at h=0.33 which corresponds to volume normal pinning via the magnetic interaction, and the other at h=0.60 which corresponds to surface ΔK pinning via the core interaction. The first peak may relate to the pinning by precipitates as observed in the four samples annealed for one day. The second peak may indicate that the boundaries between the two superconducting phases are acting as pinning centers. The 2245 sample annealed for 3 days exhibits a peak at h=0.33, but the available field extends only to approximately h=0.40. Therefore, the second peak in the flux-pinning force density curve for this sample cannot be observed, although by analogy with the 2234 sample annealed ten days and containing two superconducting phases, it is expected that a second peak exists. This sample exhibits the largest absolute values of flux pinning, a fact that is consistent with our TEM experiments showing that this sample contains the largest amount of calcium- and copper-rich precipitates.

Theoretical curves of $F_p$ versus h have the form of $h^{\frac{1}{2}}(1-h)$ for all the samples containing mostly the 85K phase, as shown in FIGS. 5a-5d. As pointed out by Dew-Hughes in Phil. Mag. 30(8), 293 (1974), the pinning function $h^{\frac{1}{2}}(1-h)$ corresponds to normal volume pinning via the magnetic interaction. This correspondence is consistent with the TEM results that the calcium- and copper-rich precipitates are finely dispersed in the sample matrix and their sizes are, in all dimensions, greater than the inter-flux line spacing d [=1.07 $(\Phi_o/B)^{\frac{1}{2}}$] (the d value is 218 Å at 5 T). Although the precipitates are widely distributed in size, only those with the appropriate dimensions greater than the penetration depth, $\lambda$, can be responsible for the normal volume pinning via the magnetic interaction.

In conclusion, a fundamental pinning mechanism in the crystallized Bi-Sr-Ca-Cu-O system has been identified, namely, normal volume pinning via the magnetic interaction by calcium-and copper-rich precipitates. This identification is based on substantial electron microscopy evidence and theoretical data fitting. By introducing large amounts of precipitates as pinning centers in the system, the magnetization critical current density $J_c(H)$ is increased by a factor of 30. In addition, for the multiphase sample (2234 annealed 10 days) the existence of two peaks in the flux pinning force density has been detected. These peaks indicate that there are two types of pinning centers, namely, the calcium- and copper-rich precipitates and the boundaries between the two superconducting phases. The rapid solidification technique is a unique method for the introduction of precipitates as pinning centers into this system by which the intragrain critical current density can be greatly enhanced in accordance with the present invention.

There has thus been shown a process for producing and resulting ceramic-oxide superconductors with improved flux pinning giving rise to increased current densities by the enrichment of certain components in the ceramic-oxide superconducting compositions to promote the formation of precipitates in the Bi-Sr-Ca-Cu-O system. The process is also characterized by the formation of glass containing enriched Ca and Cu concentrations with crystallization and precipitation induced by annealing. The formation of the precipitates is promoted by enrichment of the composition with certain components and particularly calcium and copper. In the process, enriched compositions identified by formulas $Bi_2$-$Sr_2$-$Ca_3Cu_4O_x$ (2234) and $Bi_2$-$Sr_2$-$Ca_4$-$Cu_5O_x$ (2245) are converted to molten glass and then quickly quenched. Annealing is subsequently carried out at approximately 870° C. to form crystals within the grains with a large number of small precipitates distributed throughout the grains. The precipitates vary in size from 0.01 to 0.1 microns.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A method for forming a ceramic oxide superconductor comprising the steps, in sequence, of:
   heating a ceramic oxide to a temperature above its melting point to form a liquid;
   introducing calcium or copper into the ceramic oxide liquid to the extent that the ceramic oxide is supersaturated with calcium or copper;
   quenching the ceramic oxide liquid so as to convert the ceramic oxide to a glass supersaturated with calcium or copper; and
   annealing the calcium or copper and the ceramic oxide in forming grains in the ceramic oxide and a precipitate of the calcium or copper within the grains of the ceramic oxide so as to form superconducting phases in the ceramic oxide.

2. The method of claim 1 wherein the step of quenching the ceramic oxide liquid comprises quenching a Bi-Sr-Ca-Cu-O ceramic oxide.

3. The method of claim 2 wherein the calcium or copper and the ceramic oxide are heated to a temperature of at least 870° C. in air during annealing.

4. The method of claim 3 wherein the calcium or copper and the ceramic oxide are heated to a temperature of at least 870° C. in air during annealing for at least one (1) day.

5. The method of claim 4 wherein the step of annealing further comprises slowly cooling the calcium or copper and the ceramic oxide to room temperature after heating the calcium or copper and the ceramic oxide superconductor to at least 870° C.

6. The method of claim 2 wherein the step of quenching the Bi-Sr-Ca-Cu-O superconductor comprises quenching $Bi_2Sr_2CaCuO_x$.

7. The method of claim 2 wherein the step of quenching the Bi-Sr-Ca-Cu-O superconductor comprises quenching $Bi_2Sr_2Ca_2Cu_3O_x$.

8. The method of claim 2 wherein the step of quenching the Bi-Sr-Ca-Cu-O superconductor comprises quenching $Bi_2Sr_2Ca_3Cu_4O_x$.

9. The method of claim 2 wherein the step of quenching the Bi-Sr-Ca-Cu-O superconductor comprises quenching $Bi_2Sr_2CaCu_4O_x$.

10. The method of claim 2 wherein the calcium or copper precipitate is comprised of particles ranging in size from 0.01 to 0.1 microns.

11. A ceramic oxide superconductor comprising:
   a Bi-Sr-Ca-Cu-O ceramic oxide having a plurality of grains defining intragrain spaces within each grain and intergrain spaces between adjacent grains; and
   a precipitate rich in calcium or copper uniformly disposed in the intragrain spaces of said Bi-Sr-Ca-Cu-O ceramic oxide in the form of finely divided particles so as to form superconducting phases in said ceramic oxide, wherein said ceramic oxide is supersaturated with calcium or copper.

* * * * *